(12) United States Patent
Fujikami et al.

(10) Patent No.: US 8,296,928 B2
(45) Date of Patent: *Oct. 30, 2012

(54) METHOD OF MANUFACTURING SUPERCONDUCTING WIRE

(75) Inventors: Jun Fujikami, Osaka (JP); Takeshi Kato, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/855,613

(22) Filed: Aug. 12, 2010

(65) Prior Publication Data

US 2010/0323901 A1    Dec. 23, 2010

Related U.S. Application Data

(63) Continuation of application No. 10/569,829, filed as application No. PCT/JP2005/002413 on Feb. 17, 2005, now Pat. No. 7,784,169.

(30) Foreign Application Priority Data

Jun. 24, 2004  (JP) .................................. 2004-186478

(51) Int. Cl.
*H01B 12/00*       (2006.01)
*H01B 13/00*       (2006.01)
(52) U.S. Cl. ....................................... 29/599; 174/125.1
(58) Field of Classification Search .................... 29/599; 174/125.1
See application file for complete search history.

(56) References Cited

U.S. PATENT DOCUMENTS

| 4,906,609 A | 3/1990 | Yamauchi et al. |
| 5,043,320 A | 8/1991 | Meyer et al. |
| 6,103,669 A | 8/2000 | Okayama et al. |
| 6,498,302 B2 * | 12/2002 | Kaneko ........................ 174/125.1 |
| 6,601,289 B1 * | 8/2003 | Kobayashi ........................ 29/599 |

FOREIGN PATENT DOCUMENTS

| JP | 05-250938 A | 9/1993 |
| TW | 365601 | 8/1999 |

OTHER PUBLICATIONS

Office Action dated Dec. 9, 2010 from related Korean patent application No. 10-2006-7023618.
English translation of Korean Office Action dated Dec. 9, 2010.
Office Action dated Apr. 28, 2011 in related Taiwanese patent application No. 094115153.

* cited by examiner

*Primary Examiner* — Livius R Cazan
(74) *Attorney, Agent, or Firm* — Foley & Lardner LLP

(57) ABSTRACT

A method of manufacturing a superconducting wire includes the step of drawing a wire formed by coating raw material powder for a superconductor with a metal (S6), the step of first rolling (S8) rolling a multifilamentary wire after the step of drawing (S6), and the step of first sintering (S10) sintering the multifilamentary wire 1 after the step of the first rolling (S8). At least one of an interval between the step of drawing (S6) and the step of the first rolling (S8) and an interval between the step of the first rolling (S8) and the step of the first sintering (S10) is less than seven days. With this method, a superconducting wire having high and uniform performance can be obtained.

14 Claims, 6 Drawing Sheets

METHOD OF MANUFACTURING SUPERCONDUCTING WIRE

CROSS-REFERENCE TO RELATED PATENT APPLICATIONS

This application claims priority from and is a Continuation of U.S. application Ser. No. 10/569,829, filed Feb. 28, 2006, now U.S. Pat. No. 7,784,169, a National Stage of PCT/JP2005/002413, filed Feb. 17, 2005 which claims priority from Japan Priority Application No. 2004-186478, filed Jun. 24, 2004, including the specification, drawings, claims and abstract, is incorporated herein by reference in its entirety.

TECHNICAL FIELD

The present invention relates to a method of manufacturing a superconducting wire, and in particular, to a method of manufacturing a superconducting wire capable of obtaining a superconducting wire with high and uniform performance.

BACKGROUND ART

A superconducting wire made of a multifilamentary wire formed by coating an oxide superconductor having for example Bi2223 phase with a metal is conventionally expected to be applied to a superconducting cable and a magnet, since it can be used at a temperature cooled by liquid nitrogen and a relatively high critical current density can be obtained, and it can be prolonged relatively easily.

Such a superconducting wire has been manufactured as will be described below. Firstly, a wire is fabricated to have a form in which raw material powder for a superconductor containing such as Bi2223 phase is coated with a metal. Next, by performing thermal treatment and rolling repeatedly, a superconducting phase is generated as aligned to a superconducting filament part of the wire, and thus a tape-like superconducting wire is obtained. Such a method of manufacturing a superconducting wire is disclosed for example in Japanese Patent No. 2636049 (Japanese Patent Laying-Open No. 03-138820) (Patent Document 1) and Japanese Patent No. 2855869 (Japanese Patent Laying-Open No. 04-292812) (Patent Document 2).

Patent Document 1: Japanese Patent No. 2636049 (Japanese Patent Laying-Open No. 03-138820)
Patent Document 2: Japanese Patent No. 2855869 (Japanese Patent Laying-Open No. 04-292812)

DISCLOSURE OF THE INVENTION

Problems to be Solved by the Invention

Conventionally, an optimum manufacturing condition for each manufacturing step has been sought to improve performance (such as a critical current value) of a superconducting wire. However, even when a superconducting wire is manufactured under the same optimum condition, the obtained superconducting wire has variations in each performance. Further, some of the obtained superconducting wire has poor performance, and thus a high performance superconducting wire cannot be obtained.

Therefore, an object of the present invention is to provide a method of manufacturing a superconducting wire capable of obtaining a superconducting wire with high and uniform performance.

Means to Solve the Problems

A method of manufacturing a superconducting wire in an aspect of the present invention includes the steps of drawing a wire formed by coating raw material powder for a superconductor with a metal, rolling the wire after the step of drawing, and sintering the wire after the step of rolling. At least one of an interval between the step of drawing and the step of rolling and an interval between the step of rolling and the step of sintering is less than seven days.

After careful examination, inventors of the present invention have found that the obtained superconducting wire has variations in each performance due to reasons which will be described below. In each of the intervals between the steps of drawing, rolling, and sintering, $CO_2$ (carbon dioxide), $H_2O$ (water), $O_2$ (oxygen) and the like in the air intrude into the wire through both end portions of the wire or the metal coating the superconductor. This leads to generation of a hetero phase other than the superconducting phase during sintering, or an uneven thickness of the wire. The generation of a hetero phase during sintering interferes with the generation of the superconducting phase, and deteriorates superconducting properties such as the critical current value. Further, if the wire has an uneven thickness, pressure is not uniformly applied to the wire when rolling is performed later, and thus the obtained superconducting wire has an uneven thickness. As a result, the superconducting wire has variations in each performance.

By setting at least one of the intervals between the steps of drawing, rolling, and sintering for less than seven days, a next step can be performed before $CO_2$, $H_2O$, and $O_2$ in the air intrude into the raw material powder. As a result, a hetero phase is less likely to be generated during sintering and the wire has a uniform thickness, and thus a superconducting wire having high and uniform performance can be obtained.

Conventionally, attention has not been paid to how to hold the wire in the interval between the step of drawing and the step of rolling, and in the interval between the step of rolling and the step of sintering, and a holding time period has not particularly been specified. The inventors of the present invention have found that the obtained superconducting wire has variations in each performance depending on the difference in the holding time period between these steps.

A method of manufacturing a superconducting wire in another aspect of the present invention includes the steps of drawing a wire formed by coating raw material powder for a superconductor with a metal, rolling the wire n times (n is an integer not less than 2), and sintering the wire n times. The step of first rolling in the step of rolling the wire n times is performed after the step of drawing. The step of first sintering in the step of sintering the wire n times is performed after the step of the first rolling. The step of k-th (k is an integer satisfying $n \geq k \geq 2$) rolling in the step of rolling the wire n times is performed after the step of (k−1)-th sintering in the step of sintering the wire n times. The step of k-th sintering in the step of rolling the wire n times is performed after the step of the k-th rolling in the step of rolling the wire n times. At least one of an interval between the step of drawing and the step of the first rolling, an interval between the step of the first rolling and the step of the first sintering, an interval between the step of the (k−1)-th sintering and the step of the k-th rolling, and an interval between the step of the k-th rolling and the step of the k-th sintering is less than seven days.

After careful examination, the inventors of the present invention have found that the obtained superconducting wire has variations in each performance due to reasons which will be described below. When the step of rolling the wire n times and the step of sintering the wire n times are performed to manufacture a superconducting wire, $CO_2$ (carbon dioxide), $H_2O$ (water), $O_2$ (oxygen) and the like in the air intrude into the raw material powder through both end portions of the wire or the metal coating the superconductor, in an interval between the step of drawing and the step of first rolling, an interval between the step of the first rolling and the step of first sintering, an interval between the step of (k−1)-th sintering and the step of k-th rolling, and an interval between the step of the k-th rolling and the step of k-th sintering. As a result, the performance of the superconducting wire is deteriorated as described above, and the superconducting wire has variations in each performance.

By setting at least one of the interval between the step of drawing and the step of the first rolling, the interval between the step of the first rolling and the step of the first sintering, the interval between the step of the (k−1)-th sintering and the step of the k-th rolling, and the interval between the step of the k-th rolling and the step of the k-th sintering, for less than seven days, a next step can be performed before $CO_2$, $H_2O$, and $O_2$ in the air intrude into the raw material powder. As a result, a hetero phase is less likely to be generated during sintering and the wire has a uniform thickness, and thus a superconducting wire having high and uniform performance can be obtained.

Conventionally, when the step of rolling the wire n times and the step of sintering the wire n times are performed, attention has not been paid to how to the wire in the interval between the step of drawing and the step of the first rolling, the interval between the step of the first rolling and the step of the first sintering, the interval between the step of the (k−1)-th sintering and the step of the k-th rolling, and the interval between the step of the k-th rolling and the step of the k-th sintering, and a holding time period has not particularly been specified. The inventors of the present invention have found that the obtained superconducting wire has variations in each performance depending on the difference in the holding time period between these steps.

Preferably, in the method of manufacturing a superconducting wire of the present invention, the method further includes the step of holding the wire under a reduced-pressure atmosphere in the interval of less than seven days.

By holding the wire under a reduced-pressure atmosphere, residues such as $CO_2$, $H_2O$, $O_2$ and the like contained within the wire are discharged through the both end portions of the wire or the metal coating the superconductor. As a result, a hetero phase is less likely to be generated during sintering and the wire has a uniform thickness, and thus a superconducting wire having higher and more uniform performance can be obtained.

Preferably, in the method of manufacturing a superconducting wire of the present invention, the step of holding is performed in an atmosphere of nitrogen gas, argon gas, or dry air. This can prevent impurities such as $CO_2$, $H_2O$, $O_2$ and the like from intruding into the raw material powder during the step of holding.

Preferably, in the method of manufacturing a superconducting wire of the present invention, the wire is held at a temperature of not less than 80° C. in the interval of less than seven days. This facilitates evaporation of the residues contained within the wire, and thus a superconducting wire having high and uniform performance can be obtained.

It is to be noted that rolling and sintering in the present invention may be performed only once, respectively, or may be performed a plurality of times (n times), respectively. Further, in the specification, the "first rolling" refers to the step of rolling the wire for the first time, and the "first sintering" refers to the step of sintering the wire for the first time. When the step of drawing is performed on the wire a plurality of times, the "step of drawing" refers to the last drawing performed on the wire before the first rolling. Furthermore, "dry air" refers to air having a dew point at atmospheric pressure of not more than −20° C.

Effects of the Invention

According to the method of manufacturing a superconducting wire of the present invention, by setting at least one of the intervals between the steps of drawing, rolling, and sintering for less than seven days, a next step can be performed before $CO_2$, $H_2O$, and $O_2$ in the air intrude into the raw material powder. As a result, a hetero phase is less likely to be generated during sintering and the wire has a uniform thickness, and thus a superconducting wire having high and uniform performance can be obtained.

Figure 1:
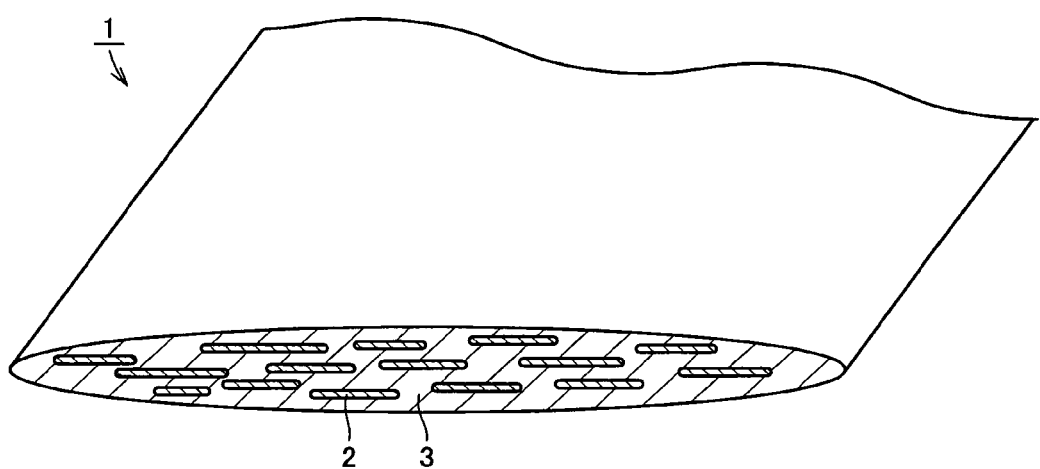
FIG. 1 is a fragmentary sectional perspective view illustrating a structure of a superconducting wire on a conceptual basis.

DESCRIPTION OF REFERENCE CHARACTERS 1. superconducting wire (multifilamentary wire), 1a. wire, 1b. clad wire, 1c. multifilamentary wire, 2. superconductor filament, 2a. raw material powder, 3. sheath part, 3a, 3b. pipe, 20. casing, 21. exhaust duct, 22. holder, 23. heater.

BEST MODES FOR CARRYING OUT THE INVENTION

In the following, an embodiment of the present invention will be described with reference to the drawings.

FIG. 1 is a fragmentary sectional perspective view illustrating a structure of a superconducting wire on a conceptual basis. Referring to FIG. 1, explanation will be given on for example a multifilamentary superconducting wire. A superconducting wire 1 has a plurality of superconductor filaments 2 extending in a longitudinal direction and a sheath part 3 coating them. Each of the plurality of superconductor filaments 2 is made of a material having composition of for example the Bi—Pb—Sr—Ca—Cu—O system, and in particular, the optimum material is a material containing Bi2223 phase in which an atomic ratio of (bismuth and lead):strontium:calcium:copper is approximately represented by 2:2:2:3. Sheath part 3 is made of a material such as silver.

It is to be noted that, although explanation has been given on a multifilamentary wire, an oxide superconducting wire having a monofilamentary structure, in which a single superconductor filament 2 is coated with sheath part 3, may be used.

Next, a method of manufacturing the oxide superconducting wire described above will be explained.

Figure 2:
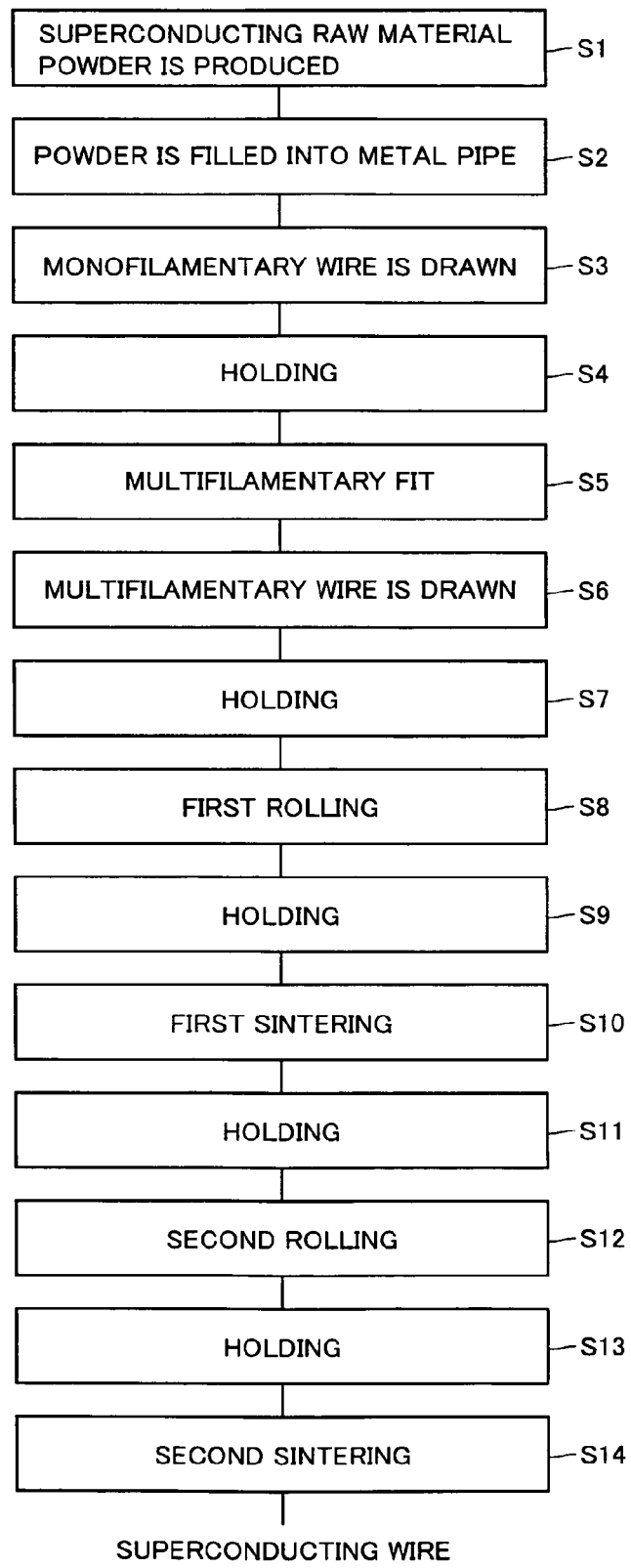
FIG. 2 is a flow chart illustrating a method of manufacturing a superconducting wire in an embodiment of the present invention.

FIG. 2 is a flow chart illustrating a method of manufacturing a superconducting wire in an embodiment of the present invention. FIGS. 3 to 8 illustrate respective steps in FIG. 2.

Referring to FIG. 2, the Powder-In-Tube method is used to manufacture a superconducting wire with for example the Bi2223 phase. Firstly, for example five kinds of raw material powder ($Bi_2O_3$, PbO, $SrCO_3$, $CaCO_3$, CuO) are mixed to produce raw material powder in an intermediate state (precursor powder) which will ultimately be changed to a superconductor with the Bi2223 phase by a reaction caused by thermal treatment (Step S1).

Figure 3:
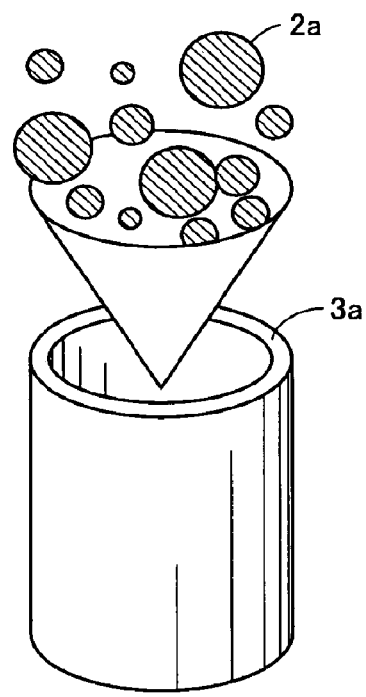
FIG. 3 is a first view illustrating a step in FIG. 2.

Next, as shown in FIGS. 2 and 3, this raw material powder 2a is filled into a pipe 3a (Step S2). Pipe 3a is made of a metal such as silver, having an outer diameter of $\phi$10 to 50 mm and a wall thickness of about 2 to 20% of the outer diameter. Thereby, a wire 1a in which raw material powder 2a for the superconductor is coated with pipe 3a is obtained.

Figure 4:
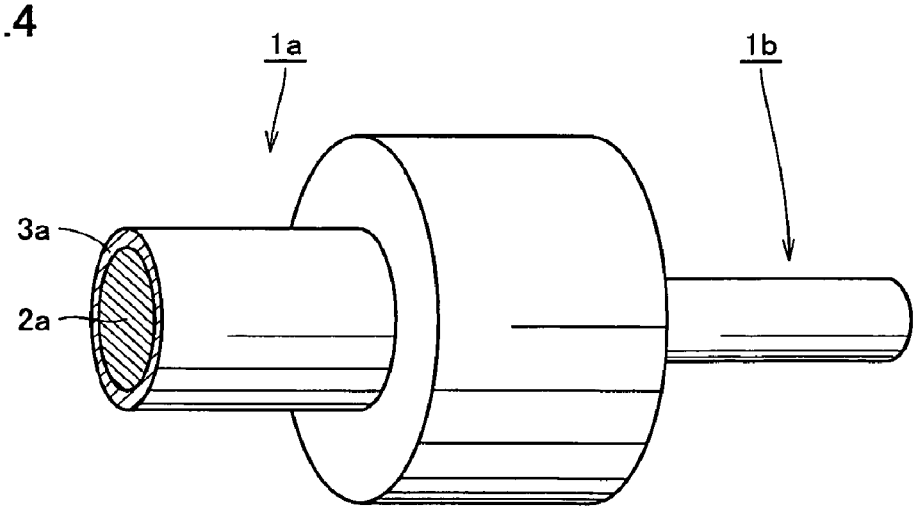
FIG. 4 is a second view illustrating a step in FIG. 2.

Next, as shown in FIGS. 2 and 4, wire 1a is drawn to form a clad wire 1b in which the precursor as a filamentary material is coated with a metal such as silver (Step S3). Clad wire 1b has a shape of a circle with a diameter of such as 2 to 10 mm.

Figure 5:
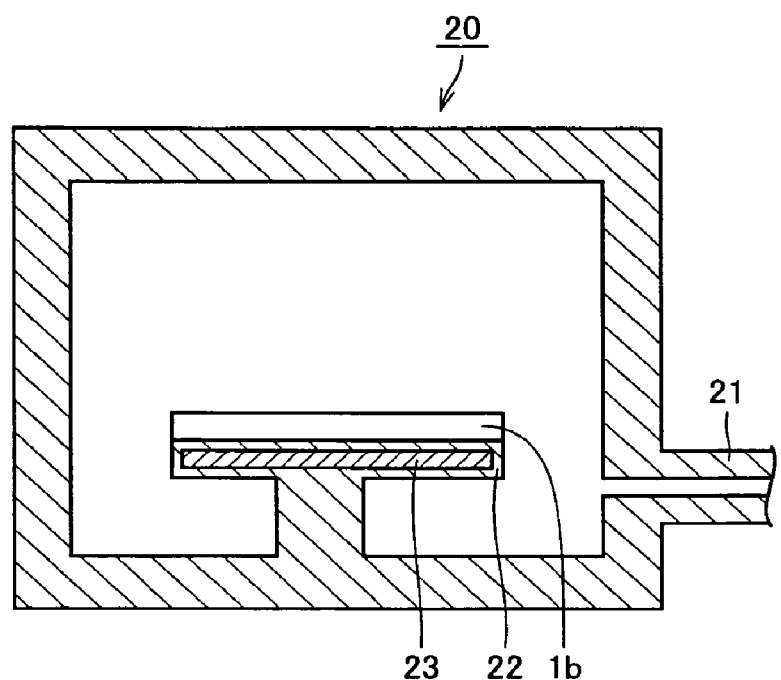
FIG. 5 is a third view illustrating a step in FIG. 2.

Next, as shown in FIGS. 2 and 5, clad wire 1b is held on a holder 22 within a casing 20 for less than seven days (Step S4). Casing 20 has an exhaust duct 21, and exhaust duct 21 is connected for example to a vacuum pump (not shown). Air inside casing 20 is exhausted by the vacuum pump through exhaust duct 21, and thus the inside of casing 20 is in an atmosphere of a reduced pressure of for example not more than 0.01 MPa. Further, the inside of casing 20 is for example in an atmosphere of nitrogen gas, argon gas, or dry air. Furthermore, a heater 23 is provided within holder 22 to heat clad wire 1b held on holder 22 to a temperature of for example not less than 80° C. Since clad wire 1b is held under the reduced-pressure atmosphere, intrusion of $CO_2$, $H_2O$, $O_2$ and the like in the air into raw material powder 2a can be suppressed. Further, $CO_2$, $H_2O$, $O_2$ and the like within clad wire 1b can be discharged.

Figure 6:
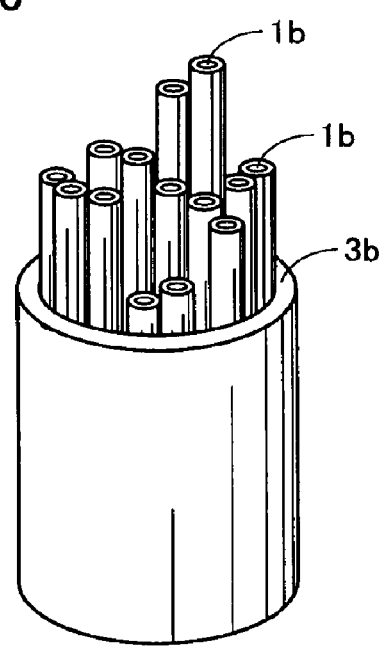
FIG. 6 is a fourth view illustrating a step in FIG. 2.

Next, as shown in FIGS. 2 and 6, a plurality of clad wires 1b are bundled to be fit into a pipe 3b made of a metal such as silver (multifilamentary fit: Step S5). This pipe 3b is made of a metal such as silver or an alloy thereof, having an outer diameter of $\phi$10 to 50 mm and a wall thickness of about 2 to 20% of the outer diameter. Thereby, a wire with a multifilamentary structure having a plurality of filaments made of raw material powder 2a is obtained.

Figure 7:
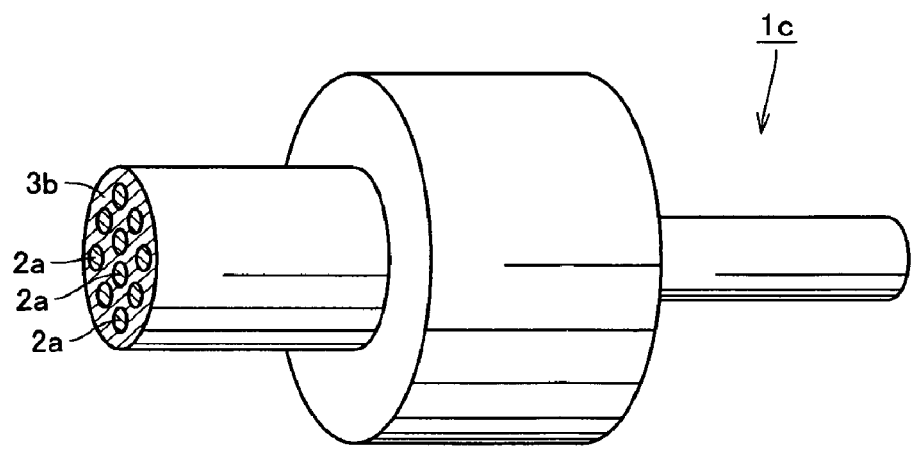
FIG. 7 is a fifth view illustrating a step in FIG. 2.

Next, as shown in FIGS. 2 and 7, the wire with the multifilamentary structure in which a plurality of filaments made of raw material powder 2a are coated with sheath part 3 is drawn to form a multifilamentary wire 1c in which raw material powder 2a is embedded within sheath part 3 made of such as silver (Step S6).

Next, as shown in FIGS. 2 and 5, multifilamentary wire 1c is held on holder 22 within casing 20 under the reduced-pressure atmosphere for less than seven days (Step S7). The inside of casing 20 is for example in an atmosphere of nitrogen gas, argon gas, or dry air. Since multifilamentary wire 1c is held under the reduced-pressure atmosphere, intrusion of $CO_2$, $H_2O$, $O_2$ and the like in the air into raw material powder 2a can be suppressed. Further, $CO_2$, $H_2O$, $O_2$ and the like within multifilamentary wire 1c can be discharged.

In the present embodiment, each step is performed such that an interval between the formation of multifilamentary wire 1c (Step S6) and first rolling (Step S8) which will be described below is set for less than seven days. This can suppress intrusion of $CO_2$, $H_2O$, $O_2$ and the like in the air into raw material powder 2a in the interval between the formation of multifilamentary wire 1c (Step S6) and the first rolling (Step S8).

Figure 8:
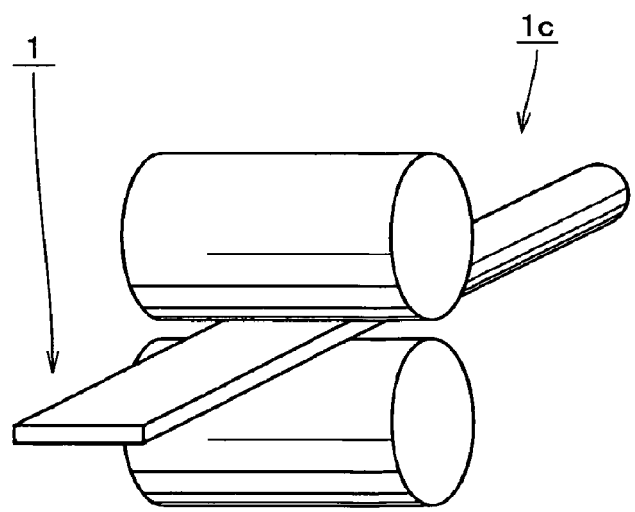
FIG. 8 is a sixth view illustrating a step in FIG. 2.

Next, as shown in FIGS. 2 and 8, the first rolling is performed on multifilamentary wire 1c to obtain tape-like multifilamentary wire 1 (Step S8). The first rolling is performed at a draft of for example 70 to 90%.

Next, as shown in FIGS. 2 and 5, multifilamentary wire 1 is held on holder 22 within casing 20 under the reduced-pressure atmosphere for less than seven days (Step S9). The inside of casing 20 is for example in an atmosphere of nitrogen gas, argon gas, or dry air. Since multifilamentary wire 1 is held under the reduced-pressure atmosphere, intrusion of $CO_2$, $H_2O$, $O_2$ and the like in the air into raw material powder 2a can be suppressed. Further, $CO_2$, $H_2O$, $O_2$ and the like within multifilamentary wire 1 can be discharged. In the present embodiment, an interval between the first rolling (Step S8) and first sintering (Step S10) which will be described below is set for less than seven days. This can suppress intrusion of $CO_2$, $H_2O$, $O_2$ and the like in the air into raw material powder 2a in the interval between the first rolling (Step S8) and the first sintering (Step S10).

Next, tape-like multifilamentary wire 1 is heated to a temperature of for example 800 to 850° C. and held at that temperature for 10 to 150 hours, and thus multifilamentary wire 1 is subjected to the first sintering (Step S10). Thereby, raw material powder 2a chemically reacts to become superconductor filament 2.

Next, as shown in FIGS. 2 and 5, multifilamentary wire 1 is held on holder 22 within casing 20 under the reduced-pressure atmosphere for less than seven days (Step S11). The inside of casing 20 is for example in an atmosphere of nitrogen gas, argon gas, or dry air. Since multifilamentary wire 1 is held under the reduced-pressure atmosphere, intrusion of $CO_2$, $H_2O$, $O_2$ and the like in the air into superconductor filament 2 can be suppressed. Further, $CO_2$, $H_2O$, $O_2$ and the like within multifilamentary wire 1 can be discharged. In the present embodiment, an interval between the first sintering (Step S10) and second rolling (Step S12) which will be described below is set for less than seven days. This can suppress intrusion of $CO_2$, $H_2O$, $O_2$ and the like in the air into filament 2 in the interval between the first sintering (Step S10) and the second rolling (Step S12).

Next, as shown in FIGS. 2 and 8, multifilamentary wire 1 is subjected to the second rolling (Step S12). The second rolling is performed at a draft of for example 0 to 20%.

Next, as shown in FIGS. 2 and 5, multifilamentary wire 1 is held on holder 22 within casing 20 under the reduced-pressure atmosphere for less than seven days (Step S13). The inside of casing 20 is for example in an atmosphere of nitrogen gas, argon gas, or dry air. Since multifilamentary wire 1 is held under the reduced-pressure atmosphere, intrusion of $CO_2$, $H_2O$, $O_2$ and the like in the air into superconductor filament 2 can be suppressed. Further, $CO_2$, $H_2O$, $O_2$ and the like within multifilamentary wire 1 can be discharged. In the present embodiment, an interval between the second rolling (Step S12) and second sintering (Step S14) which will be described below is set for less than seven days. This can suppress intrusion of $CO_2$, $H_2O$, $O_2$ and the like in the air into filament 2 in the interval between the second rolling (Step S12) and the second sintering (Step S14).

Next, multifilamentary wire 1 is heated to a temperature of 800 to 850° C. under a pressurized atmosphere and held at that temperature for 10 to 150 hours, and thus multifilamentary wire 1 is subjected to the second sintering (Step S14). Although the superconducting wire of the present embodiment is obtained as described above, further rolling and sintering may be performed after the second sintering, and the second rolling and the second sintering described above may be omitted.

The method of manufacturing a superconducting wire of the present embodiment includes the step of drawing wire $1a$ formed by coating raw material powder $2a$ for a superconductor with a metal (Step S6), the step of the first rolling (Step S8) rolling multifilamentary wire $1c$ after the step of drawing (Step S6), and the step of the first sintering (Step S10) sintering multifilamentary wire 1 after the step of the first rolling (Step S8). At least one of an interval between the step of drawing (Step S6) and the step of the first rolling (Step S8) and an interval between the step of the first rolling (Step S8) and the step of the first sintering (Step S10) is less than seven days.

The method of manufacturing a superconducting wire of the present embodiment includes the step of drawing wire $1a$ formed by coating raw material powder $2a$ for a superconductor with a metal (Step S6), the step of the first rolling (Step S8) rolling multifilamentary wire $1c$ after the step of drawing (Step S6), the step of the first sintering (Step S10) sintering multifilamentary wire 1 after the step of the first rolling (Step S8), the step of the second rolling (Step S12) rolling multifilamentary wire 1 again after the step of the first sintering (Step S10), and the step of the second sintering (Step S14) sintering multifilamentary wire 1 again after the step of the second rolling (Step S12) At least one of an interval between the step of drawing (Step S6) and the step of the first rolling (Step S8), an interval between the step of the first rolling (Step S8) and the step of the first sintering (Step S10), an interval between the step of the first sintering (Step S10) and the step of the second rolling (Step S12), and an interval between the step of the second rolling (Step S12) and the step of the second sintering (Step S14) is less than seven days.

According to the manufacturing method of the present embodiment, a next step can be performed before $CO_2$, $H_2O$ and $O_2$ in the air intrude into raw material powder $2a$ or filament 2. As a result, a hetero phase is less likely to be generated during sintering and the wire has a uniform thickness, and thus a superconducting wire having high and uniform performance can be obtained.

The method of manufacturing a superconducting wire in the present embodiment further includes the step of holding clad wire $1b$, multifilamentary wire $1c$, or multifilamentary wire 1 under a reduced-pressure atmosphere in the interval of less than seven days (Step S4, Step S7, Step S9, Step S11, Step S13).

Since clad wire $1b$, multifilamentary wire $1c$, or multifilamentary wire 1 is held under the reduced-pressure atmosphere; residues contained within clad wire $1b$, multifilamentary wire $1c$, or multifilamentary wire 1 such as $CO_2$, $H_2O$, $O_2$ and the like are discharged through both end portions of clad wire $1b$, multifilamentary wire $1c$, or multifilamentary wire 1, or sheath part 3 coating the superconductor. As a result, a hetero phase is less likely to be generated during sintering and the wire has a uniform thickness, and thus a superconducting wire having high and uniform performance can be obtained.

In the method of manufacturing a superconducting wire of the present embodiment, the step of holding (Step S4, Step S7, Step S9, Step S11, Step S13) is performed in an atmosphere of nitrogen gas, argon gas, or dry air. This can prevent impurities such as $CO_2$, $H_2O$, $O_2$ and the like from intruding into the raw material powder during the step of holding.

In the method of manufacturing a superconducting wire of the present embodiment, clad wire $1b$, multifilamentary wire $1c$, or multifilamentary wire 1 is held at a temperature of not less than 80° C. in the step of holding (Step S4, Step S7, Step S9, Step S11, Step S13). This facilitates evaporation of the residues contained within clad wire $1b$, multifilamentary wire $1c$, or multifilamentary wire 1, and thus a superconducting wire having high and uniform performance can be obtained.

Although the present embodiment has been described for the case where the step of holding (Steps S4, 7, 9, 11, 13) for less than seven days is performed in each interval, the present invention is not limited to such a case, and the step of holding (Steps S4, 7, 9, 11, 13) may be omitted. What is important is that at least one of an interval between the step of drawing and the step of the first rolling, an interval between the step of the first rolling and the step of the first sintering, an interval between the step of (k−1)-th sintering and the step of k-th rolling, and an interval between the step of the k-th rolling and the step of k-th sintering is less than seven days.

Further, although the present embodiment has been described for the case where the vacuum holding (Step S11), the second rolling (Step S12), the vacuum holding (Step S13), and the second sintering (Step S14) are performed after the first sintering (Step S10), these steps may be omitted, and a superconducting wire may be completed after the first sintering (Step S10).

Furthermore, although explanation has been given in the present embodiment on the method of manufacturing a bismuth-type multifilamentary oxide superconducting wire having the Bi2223 phase, the present invention is also applicable to a method of manufacturing an oxide superconducting wire having composition other than bismuth-type, such as yttrium-type. In addition, the present invention is also applicable to a method of manufacturing a monofilamentary superconducting wire.

EXAMPLES

In the following, examples of the present invention will be described.

First Example

In the present example, an effect of setting the interval between the step of the first rolling (Step S8) and the step of the first sintering (Step S10) for less than seven days was examined. Specifically, raw material powder $2a$ having the Bi2223 phase was produced (Step S1), and thereafter raw material powder $2a$ was filled into pipe $3a$ (Step S2) to form wire $1a$. Next, wire $1a$ was drawn to form clad wire $1b$ (Step S3), and without being subjected to the vacuum holding, a plurality of clad wire $1b$ were bundled and fit into pipe $3b$ (Step S5) to form multifilamentary wire $1c$. Next, multifilamentary wire $1c$ was drawn (Step S6), and thereafter the first rolling was performed on multifilamentary wire $1c$ (Step S8) to obtain tape-like multifilamentary wire 1. Next, without being subjected to the vacuum holding, multifilamentary wire 1 was held in the air in the range of 0 to 14 days, and thereafter the first sintering was performed on multifilamentary wire 1 (Step S10). Next, without performing the vacuum holding, the second rolling was performed (Step S12). Thereafter, without performing the vacuum holding, the second sintering is performed on multifilamentary wire 1 (Step S14) to obtain superconducting wire 1 having a length of 400 m. Next, the obtained superconducting wire 1 was divided into five pieces to measure a critical current value (A) of each piece of superconducting wire 1.

Figure 9:
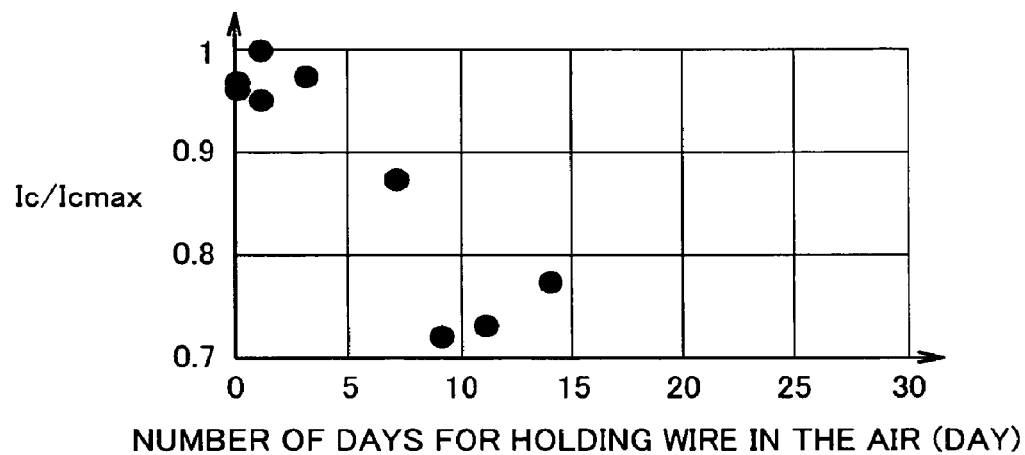
FIG. 9 shows relationship between number of days for holding the wire in the air and critical current value in a first example of the present invention.

FIG. 9 shows relationship between the number of days for holding the wire in the air and the critical current value in the first example of the present invention. The vertical axis in FIG. 9 represents a ratio of a critical current value to the highest critical current value among the measured samples.

As shown in FIG. 9, while the critical current value has a variation of more than about 13% when the wire is held in the air for not less than seven days, it has a variation of only about 5% when the wire is held in the air for less than seven days. Further, it has been found that the critical current value has a smaller variation when the wire is held in the air preferably within five days, more preferably within three days. From these results, it has been found that a high performance and uniform superconducting wire can be obtained by setting the interval between the first rolling and the first sintering for less than seven days, preferably within five days, more preferably within three days.

Second Example

In the present example, an effect of setting the interval between the step of drawing (Step S6) and the step of the first rolling (Step S8) for less than seven days was examined. Specifically, raw material powder 2a having the Bi2223 phase was produced (Step S1), and thereafter raw material powder 2a was filled into pipe 3a (Step S2) to form wire 1a. Next, wire 1a was drawn to form clad wire 1b (Step S3), and without being subjected to the vacuum holding, a plurality of clad wire 1b were bundled and fit into pipe 3b (Step S5) to form multifilamentary wire 1c. Next, multifilamentary wire 1c was drawn (Step S6). Then, without being subjected to the vacuum holding, multifilamentary wire 1 was held in the air in the range of 0 to 19 days, and thereafter the first rolling was performed on multifilamentary wire 1c (Step S8) to obtain tape-like multifilamentary wire 1. Next, the first sintering was performed on multifilamentary wire 1 (Step S10), and thereafter, without performing the vacuum holding, the second rolling was performed (Step S12). Then, without performing the vacuum holding, the second sintering is performed on multifilamentary wire 1 (Step S14) to obtain superconducting wire 1 having a length of 400 m. Next, the obtained superconducting wire 1 was divided into five pieces to measure a critical current value (A) of each piece of superconducting wire 1.

Figure 10:
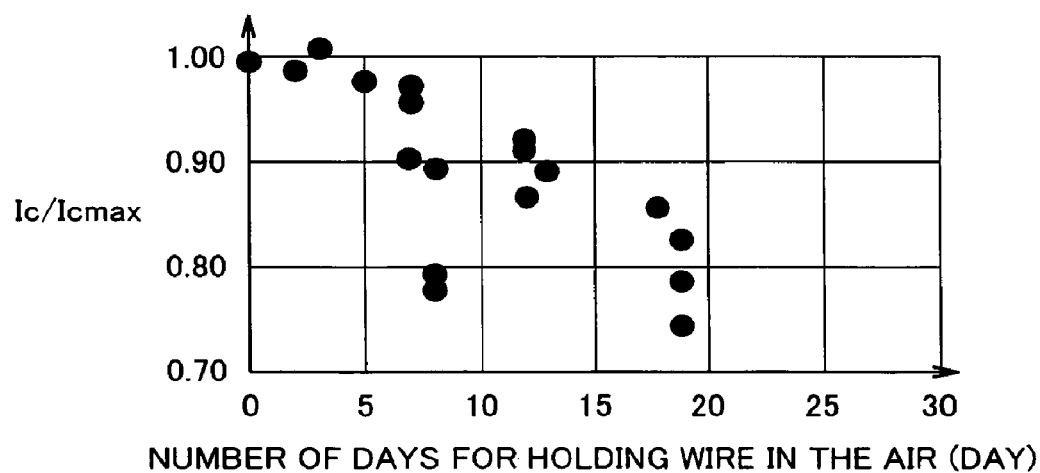
FIG. 10 shows relationship between number of days for holding the wire in the air and critical current value in a second example of the present invention.

FIG. 10 shows relationship between the number of days for holding the wire in the air and the critical current value in the second example of the present invention. The vertical axis in FIG. 10 represents a ratio of a critical current value to the highest critical current value among the measured samples.

As shown in FIG. 10, while the critical current value has a variation of more than about 10% when the wire is held in the air for not less than seven days, it has a variation of about 2% at a maximum when the wire is held in the air for less than seven days. Further, it has been found that the critical current value has a smaller variation when the wire is held in the air preferably within five days, more preferably within three days. From these results, it has been found that a high performance and uniform superconducting wire can be obtained by setting the interval between the drawing and the first rolling for less than seven days, preferably within five days, more preferably within three days.

Third Example

In the present example, an effect of holding the wire at a temperature of not less than 80° C. in the interval between the first rolling (Step S8) and the first sintering (Step S10) was examined. Specifically, the first rolling (Step S8) was performed on multifilamentary wire 1c to obtain tape-like multifilamentary wire 1. Thereafter, multifilamentary wires 1 of samples 4, 5, 6, and 7 were held for three days (72 hours) at room temperature, 50° C., 80° C., and 300° C., respectively, and then they were subjected to the first sintering (Step S10). It is to be noted that, since other steps of manufacturing multifilamentary wire 1 were almost similar to those in the first example, the description thereof will not be repeated. Thus, two pieces of superconducting wire 1 each having a length of 400 m were manufactured for each sample. Next, the obtained superconducting wire 1 was divided into five pieces to measure a critical current value (A) of each piece of superconducting wire 1. Table 1 shows the results.

TABLE 1

| Sample No. | | Critical Current Value (A) |
|---|---|---|
| 4 | Lot A | 80~90 |
|   | Lot B | 80~90 |
| 5 | Lot A | 80~90 |
|   | Lot B | 80~90 |
| 6 | Lot A | 85~90 |
|   | Lot B | 85~90 |
| 7 | Lot A | 85~90 |
|   | Lot B | 85~90 |

As shown in Table 1, as for samples 4 and 5, the critical current value was 80 to 90 (A) in both lot A and lot B. On the other hand, as for samples 6 and 7, the critical current value was 85 to 90 (A) in both lot A and lot B.

From the results obtained above, since samples 6 and 7 have higher critical current values than those in samples 4 and 5, and they also have smaller variations in the critical current values, it has been found that a high performance superconducting wire can be obtained by holding the wire between the first rolling and the first sintering at not less than 80° C.

It should be understood that the embodiment and the examples herein disclosed are by way of illustration in all respects and not to be taken by way of limitation. The scope of the present invention is defined not by the above description but by the appended claims, and is intended to include all the modifications within the meaning and the scope equivalent to those of the claims.

The invention claimed is:

1. A method of manufacturing a superconducting wire, comprising the steps of:
    drawing a wire formed by coating raw material powder for a superconductor with a metal;
    rolling said wire after said step of drawing said wire; and
    sintering said wire after said step of rolling;
    wherein at least one interval between (i) said step of drawing said wire and said step of rolling or (ii) said step of rolling and said step of sintering, is up to three days;
    setting the temperature of a heater adapted to provide heat to said wire such that said wire is maintained at a substantially constant temperature of less than or equal to 300° C. for the entire duration of the at least one interval of up to three days;
    maintaining the temperature of said wire at a substantially constant temperature during the at least one interval of up to three days; and
    holding said wire in an interior volume of a container having a reduced pressure atmosphere to suppress $CO_2$, $H_2O$, and $O_2$ from intruding into said wire, the pressure being reduced relative to the pressure outside the container during at least one of the interval between said step of drawing said wire and said step of rolling and the interval between said step of rolling and said step of sintering;

wherein said holding said wire in a reduced pressure atmosphere occurs after said drawing and before said rolling; and wherein an entire duration from a beginning of said drawing to an end of said rolling is free of sintering.

2. The method of claim 1, wherein said wire is held in an atmosphere comprising at least on of nitrogen, argon or dry air during at least one of the interval between said step of drawing said wire and said step of rolling and the interval between said step of rolling and said step of sintering.

3. The method of claim 1, further comprising maintaining said wire temperature greater than or equal to 80° C. and less than or equal to 300° C. during the interval between the drawing said wire and the rolling.

4. The method of claim 1, further comprising holding the wire in a casing during the at least one interval of up to three days.

5. The method of claim 1, further comprising maintaining the interior volume of the container to have the reduced pressure atmosphere for the entire duration of the at least one interval of up to three days.

6. The method of claim 5, wherein the reduced pressure atmosphere is maintained at a pressure of up to 0.01 MPa.

7. The method of claim 1, wherein said sintering is followed by holding said wire in a reduced pressure atmosphere and rolling said wire after said sintering and said holding steps.

8. A method of manufacturing a superconducting wire, comprising:

drawing a wire formed by coating raw material powder for a superconductor with a metal;

rolling said wire after said step of drawing said wire; and sintering said wire after said step of rolling;

wherein at least one interval between (i) said step of drawing said wire and said step of rolling or (ii) said step of rolling and said step of sintering, is up to three days;

setting the temperature of a heater adapted to provide heat to said wire such that said wire is maintained at a substantially constant temperature of less than or equal to 300° C. for the entire duration of the at least one interval of up to three days;

maintaining the temperature of said wire at a substantially constant temperature during the at least one interval of up to three days; and holding said wire in an interior volume of a container having a reduced pressure atmosphere to suppress $CO_2$, $H_2O$, and $O_2$ from intruding into said wire, the pressure being reduced relative to the pressure outside the container during at least one of the interval between said step of drawing said wire and said step of rolling and the interval between said step of rolling and said step of sintering;

wherein said drawing is a first drawing; wherein said rolling is a first rolling; wherein said sintering is a first sintering; wherein the holding said wire in a reduced pressure atmosphere occurs before said first rolling and before said first sintering.

9. The method of claim 8, wherein said wire is held in an atmosphere comprising at least one of nitrogen, argon or dry air during at least one of the interval between said step of drawing said wire and said step of rolling and the interval between said step of rolling and said step of sintering.

10. The method of claim 8, further comprising maintaining said wire temperature greater than or equal to 80° C. and less than or equal to 300° C. during the interval between the drawing said wire and the rolling.

11. The method of claim 8, further comprising holding the wire in a casing during the at least one interval of up to three days.

12. The method of claim 8, further comprising maintaining the interior volume of the container to have the reduced pressure atmosphere for the entire duration of the at least one interval of up to three days.

13. The method of claim 8, wherein the reduced pressure atmosphere is maintained at a pressure of up to 0.01 MPa.

14. The method of claim 8, wherein said sintering is followed by holding said wire in a reduced pressure atmosphere and rolling said wire after said sintering and said holding steps.

* * * * *